United States Patent
Takemura (10) Patent No.: US 7,389,803 B2
(45) Date of Patent: Jun. 24, 2008

(54) METHOD AND APPARATUS FOR MANUFACTURING SEMICONDUCTOR APPARATUS

(75) Inventor: Hisao Takemura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 403 days.

(21) Appl. No.: 11/154,720

(22) Filed: Jun. 17, 2005

(65) Prior Publication Data

US 2005/0230798 A1   Oct. 20, 2005

Related U.S. Application Data

(62) Division of application No. 10/247,524, filed on Sep. 20, 2002, now Pat. No. 6,939,429.

(30) Foreign Application Priority Data

Jun. 25, 2002   (JP) .............................. 2002-184753

(51) Int. Cl.
   *B29C 65/00* (2006.01)
(52) U.S. Cl. ........................ 156/361; 156/543; 156/578
(58) Field of Classification Search ................ 156/361, 156/538, 543, 552, 578, 379.6; 226/24; 198/347.1, 198/347.3
   See application file for complete search history.

(56) References Cited

U.S. PATENT DOCUMENTS

| 5,549,716 | A | * | 8/1996 | Takahashi et al. ........... 29/25.01 |
| 5,656,110 | A | * | 8/1997 | Herklotz et al. ............... 156/64 |
| 6,077,382 | A | * | 6/2000 | Watanabe .................... 156/322 |
| 6,722,412 | B2 | | 4/2004 | Huang et al. |
| 2001/0020519 | A1 | | 9/2001 | Oh |
| 2003/0094241 | A1 | | 5/2003 | Huang et al. |

FOREIGN PATENT DOCUMENTS

GB   2288909 A   * 11/1995

OTHER PUBLICATIONS

European Search Report dated May 2, 2006 for Appln. No. 02020903.7-2203.

* cited by examiner

*Primary Examiner*—Jeff H. Aftergut
*Assistant Examiner*—Daniel McNally
(74) *Attorney, Agent, or Firm*—Pillsbury Winthrop Shaw Pittman, LLP (57) ABSTRACT

A manufacturing line has a feeder for feeding a hoop substrate, a bake oven for heating and drying the fed hoop substrate, a die bonding device for applying an adhesive to a predetermined position on the dried substrate to mount an IC chip, and a cure oven for bonding the IC chip to the hoop substrate by heating and curing the adhesive.

7 Claims, 7 Drawing Sheets

METHOD AND APPARATUS FOR MANUFACTURING SEMICONDUCTOR APPARATUS

CROSS-REFERENCE TO RELATED APPLICATIONS

This application is a divisional of U.S. application Ser. No. 10/247,524, now U.S. Pat. No. 6,939,429, filed Sep. 20, 2002, and for which priority is claimed under 35 U.S.C. §121. This application is based upon and claims the benefit of priority under 35 U.S.C. § 119 from the prior Japanese Patent Application No. 2002-184753, filed Jun. 25, 2002, the entire contents of both applications are incorporated herein by reference in their entireties.

BACKGROUND OF THE INVENTION

1. Field of the Invention

This invention relates to a method and apparatus for manufacturing a semiconductor apparatus wherein a semiconductor device is mounted on a long tape-like substrate.

2. Description of the Related Art

Conventionally, an IC module to be mounted on a contact type IC card, for example, is known as a semiconductor apparatus. As a method of manufacturing an IC module, there is a known method of mounting a plurality of IC chips (semiconductor devices) on a long tape-like substrate (hoop substrate), thereby manufacturing a plurality of IC modules in a batch.

If a plurality of IC chips are mounted on a hoop substrate as described above, the tape-like hoop substrate is made to run, and a heat-cured adhesive is applied to predetermined positions on the substrate. The IC chips are mounted thereon. The adhesive with the substrate is heated to a high temperature, thereby curing the adhesive, and bonding the plurality of IC chips to the hoop substrate.

The hoop substrate is then wound once, and passed into another processing apparatus. The hoop substrate is made to run again. Electrical bonding is then performed, using gold wiring, between the IC chip bonded to the substrate and a pad on the substrate.

Next, the hoop substrate is rewound and passed into another processing apparatus. The IC chip subjected to bonding is molded on the substrate using an epoxy resin.

However, in the above manufacturing apparatus, when an IC chip is mounted on a hoop substrate with an adhesive and afterwards the adhesive is heated to cure, moisture within the substrate or moisture in an atmosphere adhering to the substrate surface is suddenly heated to boiling point. This vapor causes bubbles in the adhesive. There is a problem that the IC chip may not be correctly fixed due to being moved.

The faster the hoop substrate is moved and the faster it is heated, in order to enhance the manufacturing efficiency of the IC modules, the more pronounced this problem becomes.

It is also necessary to wind the hoop substrate several times to be passed into other processing apparatuses until the IC chip is molded. This results in processing inefficiency, and the procedure is complicated.

BRIEF SUMMARY OF THE INVENTION

The present invention has been made in view of the above problems, and the object of the present invention is to provide a method and apparatus for manufacturing a semiconductor apparatus which can increase yield of the semiconductor apparatus and enhance manufacturing efficiency.

In order to achieve the above object, an apparatus for manufacturing a semiconductor apparatus according to an embodiment of the present invention comprises a feed mechanism which feeds a long tape-like substrate in a longitudinal direction thereof; a mounting section which mounts a semiconductor device by applying a heat-cured adhesive to a predetermined position on the substrate fed by the feed mechanism; a pretreatment section, provided immediately upstream of the mounting section, which heats and dries the substrate; and a heating and curing section which heats and cures the adhesive applied in the mounting section.

An apparatus for manufacturing a semiconductor apparatus according to an embodiment of the present invention comprises a feed mechanism which feeds a long tape-like substrate in a longitudinal direction thereof; a mounting section which mounts a semiconductor device by applying a heat-cured adhesive to a predetermined position on the substrate fed by the feed mechanism; a pretreatment section, provided immediately upstream of the mounting section, which heats and dries the substrate; a heating and curing section which heats and cures the adhesive applied in the mounting section; and a storage section which stores the substrate fed by the feed mechanism.

Further, a method of manufacturing a semiconductor apparatus according to an embodiment of the present invention comprises a feeding step of feeding a long tape-like substrate in a longitudinal direction thereof; a pretreatment step of heating and drying the substrate fed in the feeding step; a mounting step of mounting a semiconductor device by applying a heat-cured adhesive to a predetermined position on the substrate which has been dried in the pretreatment step; and a bonding step of bonding a semiconductor device to the substrate by heating and curing the adhesive applied in the mounting step.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will be described below with reference to the drawings.

Figure 1:
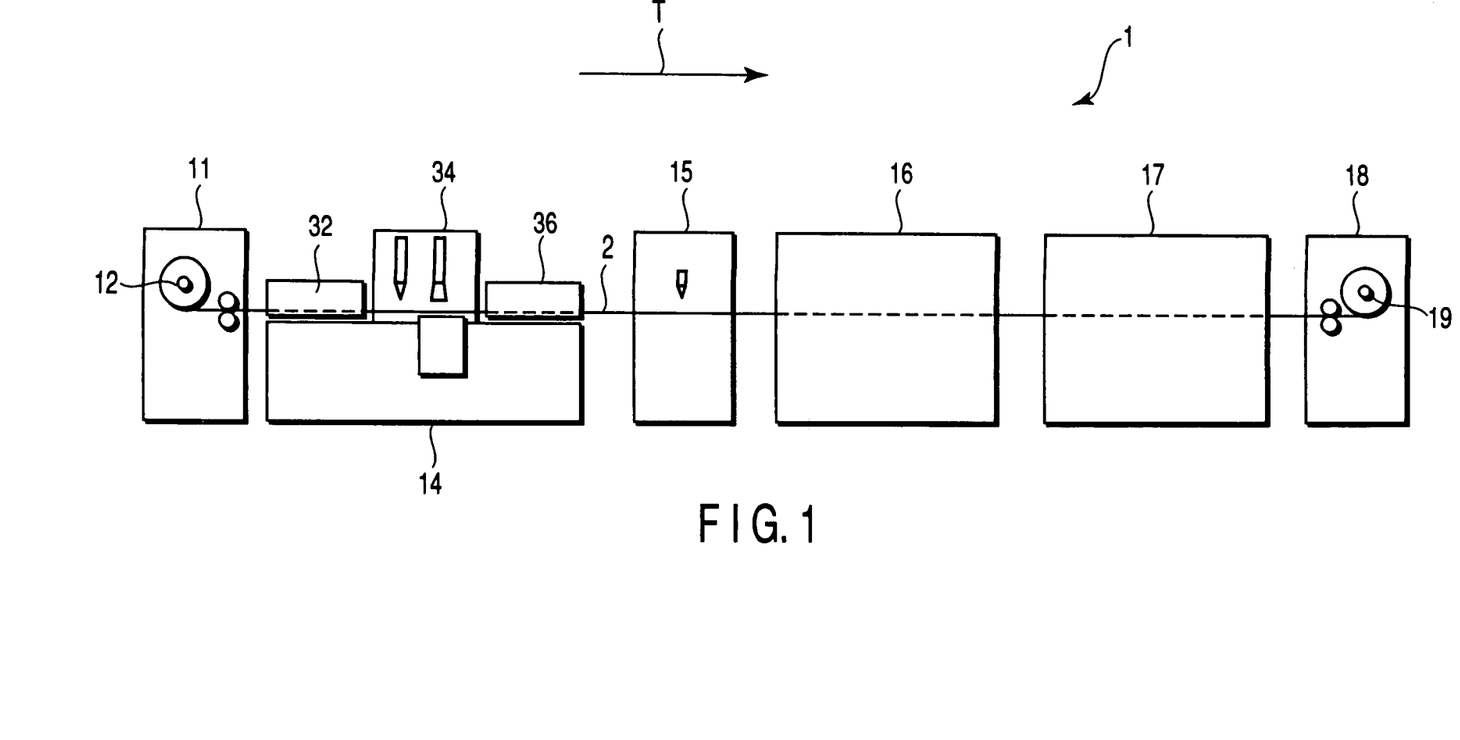
FIG. 1 is a schematic diagram showing a manufacturing line for an IC module according to a first embodiment of the present invention.
Figure 2:
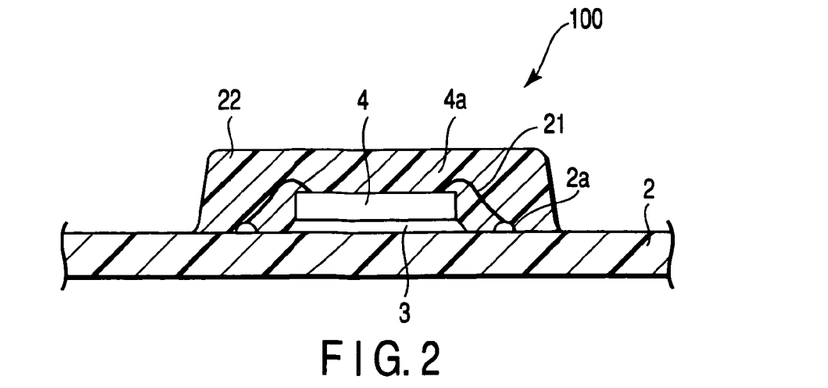
FIG. 2 is a cross-sectional view showing an IC module manufactured by the manufacturing line of FIG. 1.

FIG. 1 schematically shows a manufacturing line (manufacturing apparatus) 1 for an IC module (semiconductor apparatus) according to a first embodiment of the present invention. FIG. 2 is a cross-sectional view showing an IC module 100 manufactured by this manufacturing line 1. The IC module 100 is mounted on, for example, a contact type IC card, such as a credit card, or ID card.

As shown in FIG. 1, the manufacturing line 1 has a feeder (feeding mechanism) 11 for feeding a long tape-like substrate, i.e., hoop substrate 2 (see FIGS. 5 and 6) in a longitudinal direction of the substrate (direction of the arrow T in FIG. 1). The hoop substrate 2 is made of, for example, a glass epoxy resin. The feeder 11 has a feed shaft 12 wound with the hoop substrate 2. By rotating the feed shaft 12 in a counterclockwise direction, the hoop substrate 2 is fed in the direction of the arrow T.

Next to and downstream of the feeder 11, in the direction of the arrow T, a chip mounting device 14 is provided for fixedly bonding a plurality of IC chips (semiconductor devices) 4 (see FIG. 2), via an adhesive 3, to predetermined positions on the hoop substrate 2. The chip mounting device 14 will be described later.

A wire bonding device (bonding section) 15, a mold device (mold section) 16, and an inspection device (inspection section) 17 are provided in this order, downstream of the chip mounting device 14.

Further downstream of the inspection device 17, a winding device (winding mechanism) 18 is provided for winding the hoop substrate 2 which has been fed by the feeder 11 and has passed each of the devices 14, 15, 16 and 17. The winding device 18 has a winding shaft 19 for winding the hoop substrate 2. By rotating the winding shaft 19 in a counterclockwise direction, the hoop substrate 2 mounted with the IC chip 4 (as shown in FIG. 2) is wound.

The wire bonding device 15 provided adjacent to the chip mounting device 14 electrically connects the IC chip 4 which is mounted on the hoop substrate 2 by the chip mounting device 14, to the substrate 2. More specifically, the wire bonding device 15 connects a connection terminal 4a provided in advance on the IC chip 4 and a pad 2a provided in advance on a predetermined position of the upper surface of the hoop substrate 2, with gold wire 21, as shown in FIG. 2.

The mold device 16 molds the IC chip 4 electrically connected to the hoop substrate 2 using wire bonding. More specifically, molding is performed with an epoxy resin 22 using a die (not shown) so as to cover the IC chip 4 on which wire bonding has been performed, as shown in FIG. 2.

The inspection device 17 inspects the IC module 100 molded in a state as shown in FIG. 2. More specifically, the inspection device 17 inspects the IC chip 4, the hoop substrate 2, and the connection state between both, such as the mounting position of each IC chip 4, and bonding state.

The manufacturing line 1 described above may have a storage device for storing the hoop substrate 2, by sagging the hoop substrate 2 which is fed by the feeder 11 and wound by the winding device 18. A manufacturing line having a storage device will be explained later as a second embodiment.

Figure 3:
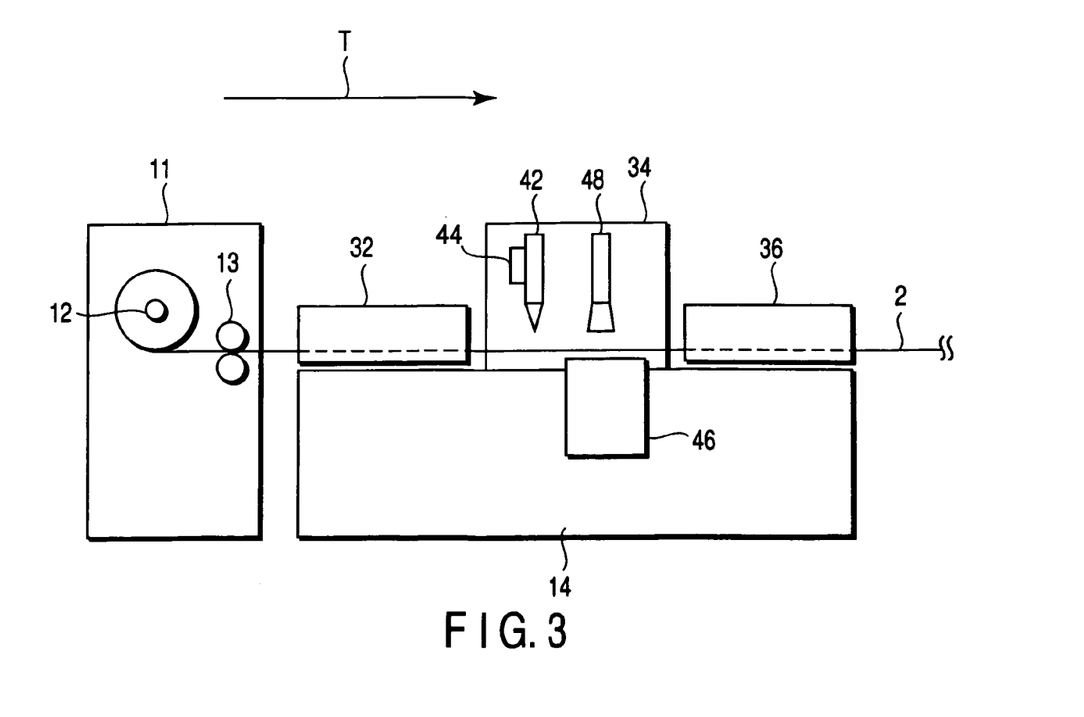
FIG. 3 is an enlarged schematic diagram showing a main part of the manufacturing line of FIG. 1.

As shown in FIG. 3, the chip mounting device 14 has a bake oven (pretreatment section, heating section) 32, a die bonding device (mounting section) 34, and a cure oven (heating and curing section) 36, along the feeding direction T of the hoop substrate 2.

The bake oven 32 heats the hoop substrate 2 by causing the substrate 2 to pass through a tunnel-like chamber. By heating the hoop substrate 2, the bake oven 32 functions to vaporize moisture within the hoop substrate 2 and moisture in an atmosphere adhering to the substrate surface, and heat the hoop substrate 2 to a predetermined temperature. In other words, the bake oven 32 has such a length that can dry the passing hoop substrate 2 to a desired state and heat the hoop substrate 2 to a predetermined temperature. The length of the bake oven 32 may be changed according to the feeding speed of the hoop substrate 2.

The die bonding device 34 has a coater 42, a heater 44, an IC chip storage section 46, and a chip mount device 48. The coater 42 applies the insulating adhesive 3 to predetermined positions on the hoop substrate 2. The heater 44 preheats the adhesive 3 to a predetermined temperature before it is deposited by the coater 42. The chip mount device 48 has a robot arm that transfers the IC chips 4 from the IC chip storage section 46 onto the adhesive 3 coated by the coater 42.

The adhesive 3 to be applied onto the hoop substrate 2 by the coater 42 is a heat-cured type, and is cured at a predetermined temperature. The adhesive 3, which is kept cold, is heated to room temperature, and then maintained at a predetermined temperature by the heater 44.

The cure oven 36 heats the hoop substrate 2 by causing the substrate 2 to pass through a tunnel-like chamber. In the cure oven 36, by heating the hoop substrate 2, the adhesive 3 applied onto the substrate 2 by the coater 42 is heated to cure, thereby fixedly bonding the IC chip 4 to the hoop substrate 2. The length of the cure oven 36 in the feeding direction T may be changed according to the feeding speed of the hoop substrate 2.

Figure 4:
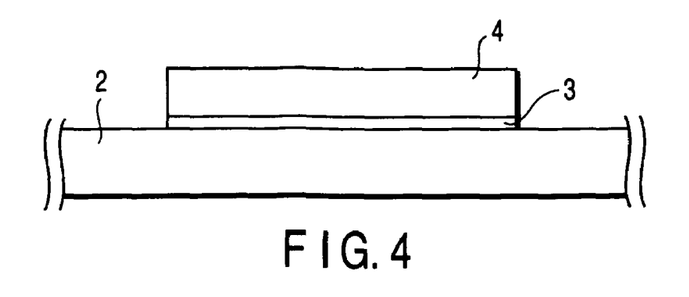
FIG. 4 is a side view showing an assembly manufactured by the structure of FIG. 3.
Figure 5:
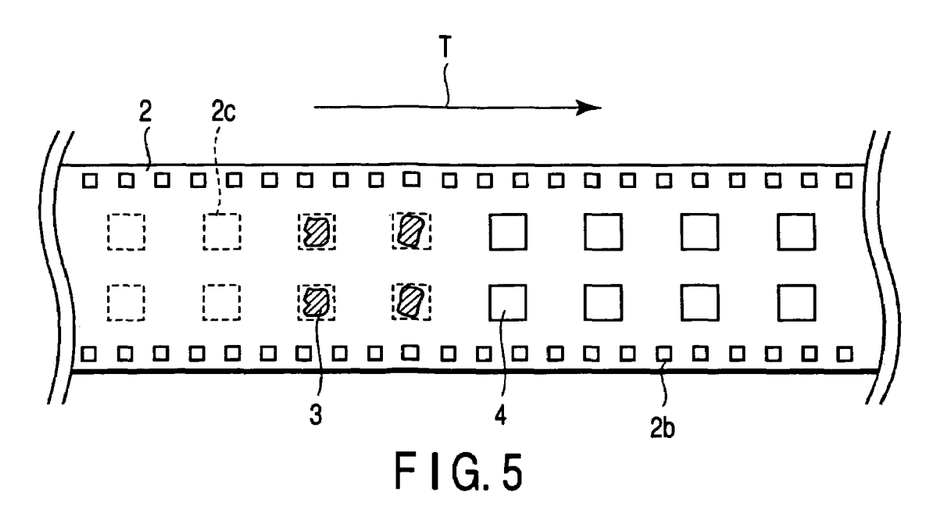
FIG. 5 is a plan view showing a hoop substrate as viewed from the IC chip side, for explaining the process of manufacturing the assembly of FIG. 4.
Figure 6:
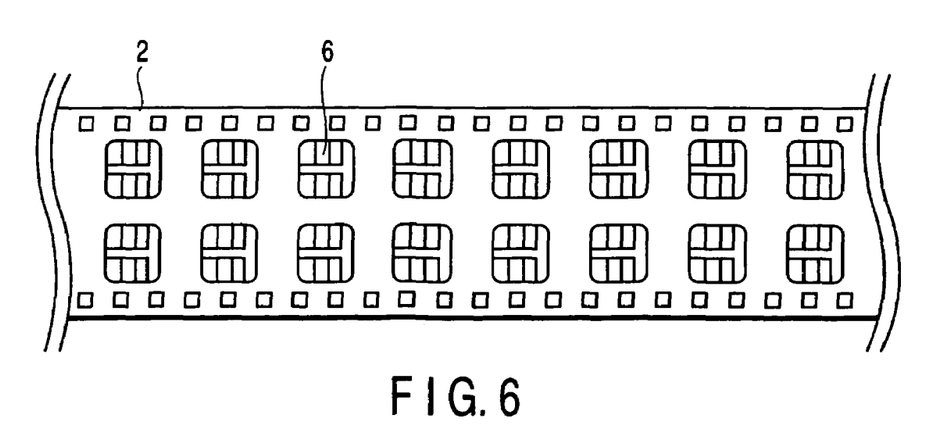
FIG. 6 is a bottom view of the hoop substrate of FIG. 5.

The operation of manufacturing the IC module 100 shown in FIG. 2 using the above manufacturing line 1 will be explained with reference to FIGS. 4 to 6. FIG. 4 is a side view showing an assembly in a state where the IC chip 4 is fixedly bonded to the hoop substrate 2. FIG. 5 is a plan view of the hoop substrate 2 for explaining the process of applying the adhesive to the hoop substrate 2 to mount the IC chip 4. FIG. 6 is a bottom view of the hoop substrate 2. As shown in FIG. 6, a contact surface 6, as an external connection terminal for an IC module, is preformed on the bottom surface side of the hoop substrate 2, according to the number and type of IC chips 4.

Prior to operation, a reel of hoop substrate 2, wound around the feed shaft 12, is set in the feeder 11. The feed shaft 12 is rotated and a conveyor roller 13 is rotated, thereby feeding the hoop substrate 2 from the feeder 11 in the direction of the arrow T.

On both sides of the hoop substrate 2 in the feeding direction T, a plurality of sprocket holes 2b are provided at regular intervals, as shown in FIGS. 5 and 6. A plurality of projections (not shown) engaging with the sprocket holes 2b are provided on the peripheral surface of the conveyor roller 13. Thus, by rotating the conveyor roller 13, the hoop substrate 2 is fed out. The devices 14, 15, 16, 17 and 18 also have a conveyor mechanism that acts on the sprocket holes 2b, like the above conveyor roller 13.

The hoop substrate 2 fed from the feeder 11 is passed through the bake oven 32 of the chip mounting device 14 and heated to be dried to a desired state. The desired state refers to a dry state reached when moisture within or adhering to the hoop substrate 2, which would otherwise cause bubbles in the adhesive 3 in a heating/curing process in the cure oven 36 in the bonding process at the latter stage, is dried up.

Then, immediately after being dried (before moisture in an atmosphere does not adhere thereto), the hoop substrate 2 is passed through the die bonding device 34. In the die bonding device 34, the adhesive 3 is applied to a predetermined position 2c (see FIG. 5) on the hoop substrate 2 using the coater 42. An IC chip 4, removed from the IC chip storage section 46, is mounted on the adhesive 3 by the chip mount device 48. At this time, the robot arm of the chip mount device 48 precisely positions the IC chip 4 relative to the predetermined position 2c on the hoop substrate 2, and sets the IC chip 4 at a precise angle. The adhesive 3 is preheated by the heater 44 before being applied to the predetermined position 2c on the hoop substrate 2.

The hoop substrate 2, which has passed through the die bonding device 34, is passed through the cure oven 36. The adhesive 3 is heated to cure, and the IC chip 4 is fixedly bonded to the hoop substrate 2. This state is shown in FIG. 4. In this state, since the hoop substrate 2 has passed through the bake oven 32 to dry it, no bubbles are formed in the adhesive 3, and the IC chip is prevented from being bonded out of place. The hoop substrate 2 is preheated by being passed through the bake oven 32, and the adhesive 3 is preheated by the heater 44. This can significantly reduce the processing time in the cure oven 36.

Further, the hoop substrate 2, which has passed through the cure oven 36, is passed through the wire bonding device 15. Thereby, all the IC chips 4 fixedly bonded to the substrate 2 are electrically connected to the substrate 2 using wire bonding. Next, the hoop substrate 2 is passed through the mold device 16, thereby molding the IC chip 4. The IC chip 4 is then passed through the inspection device 17 to be inspected.

Finally, the hoop substrate 2 having the plurality of inspected IC modules 100 is wound by the winding shaft 19 of the winding device 18. Afterwards, if necessary, the wound hoop substrate 2 is taken from the manufacturing line 1 and set in another apparatus (not shown). The IC modules 100 are cut out from the hoop substrate 2.

As described above, according to the embodiment of the present invention, as a pretreatment before applying the adhesive 3 to the hoop substrate 2 to mount the IC chip 4, the hoop substrate 2 is passed through the bake oven 32 to be dried. Thus, in the bonding process after mounting the IC chip 4 on the hoop substrate 2, when the adhesive 3 is heat-cured in the cure oven 36, bubbles can be prevented from forming in the adhesive 3 due to vaporization of undesired moisture in the interior of the hoop substrate 2 or moisture undesirably adhering to the hoop substrate 2. This can prevent the deviation of the mounting position of the IC chip 4 or the angle thereof, and enhance yield of the IC module 100.

According to the embodiment of the present invention, the hoop substrate 2 is preheated by the bake oven 32 before being passed through the cure oven 36, thereby reducing the heat treatment time in the cure oven 36. That is, the length of the cure oven 36 and the length of the manufacturing line 1 can be shortened, and at the same time, the feeding speed of the hoop substrate 2 can be hastened. Thereby, the manufacturing efficiency of the IC module can be enhanced.

Next, a manufacturing line 50 according to a second embodiment of the present invention will be explained with reference to FIGS. 7 to 9.

Figure 7:
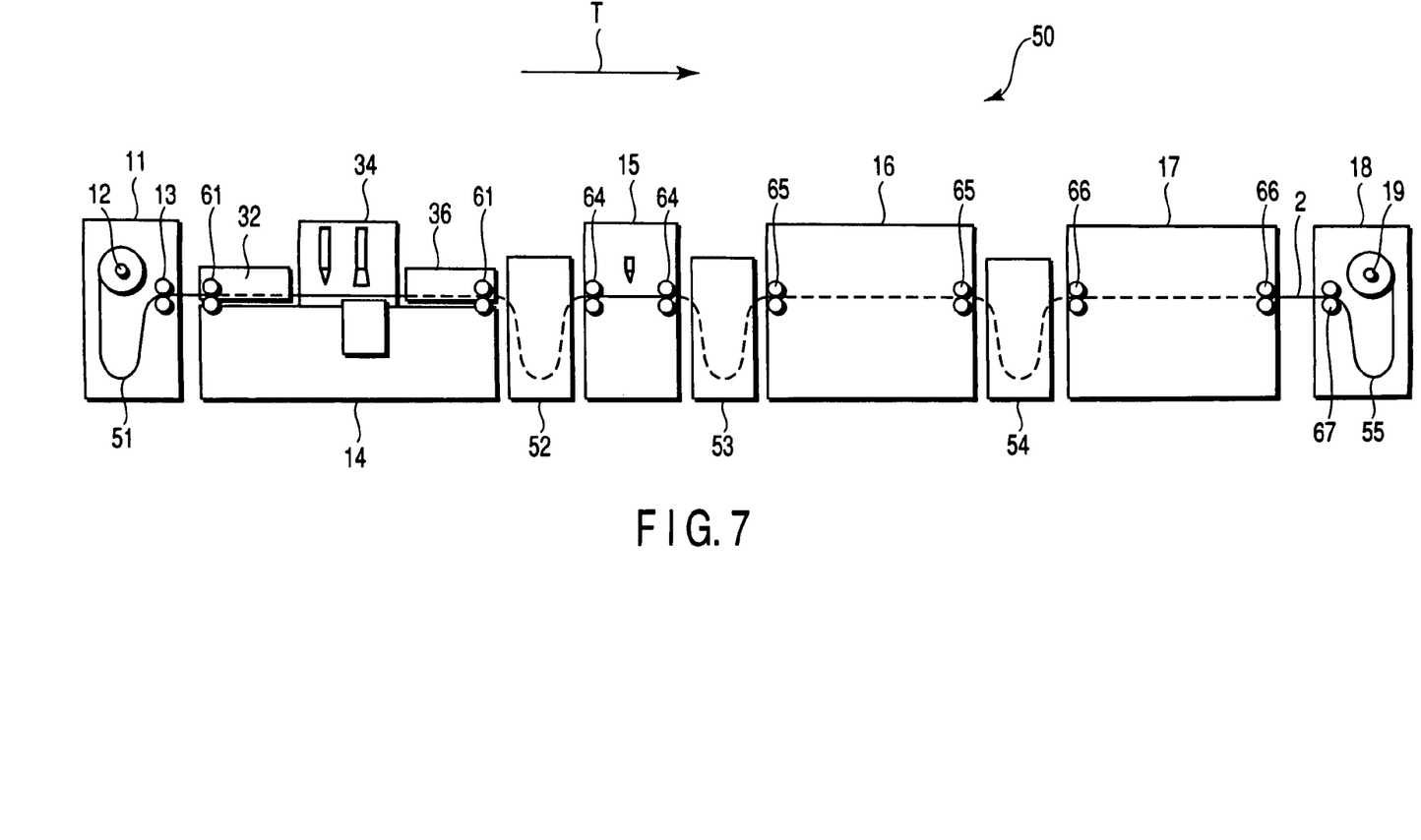
FIG. 7 is a schematic diagram showing a manufacturing line according to a second embodiment of the present invention.

As shown in FIG. 7, in the manufacturing line 50 of this embodiment, a feeder 11 and a winding device 18 have built-in storage devices 51 and 55, respectively. Storage devices 52, 53 and 54 are also provided between devices 14 and 15, 15 and 16, and 16 and 17, respectively. Since the other structures are the same as those in the above-described first embodiment, like reference numerals denote like elements, and the detailed description thereof is omitted.

Each of the storage devices (storage sections) 51 to 55 functions to temporarily store the hoop substrate 2, when the process speed of each of the devices 11, 14, 15, 16, 17 and 18 is not constant, or each device comes to a stop for some reason.

As described above, by providing a plurality of storage devices 51 to 55 in the manufacturing line 50, the processing can continue without stopping the manufacturing line 50, even if each of the devices 11, 14, 15, 16, 17 and 18 temporarily stops. Also, wire bonding and molding for the IC chip 4 bonded onto the substrate 2 can be performed on one line.

The storage devices 51 to 55 will be described below. In this embodiment, the two storage devices 51 and 55 have laterally symmetrical structures, and the three storage devices 52, 53 and 54 have substantially the same structure. Thus, the storage devices 51 and 52 will be representatively described.

Figure 8:
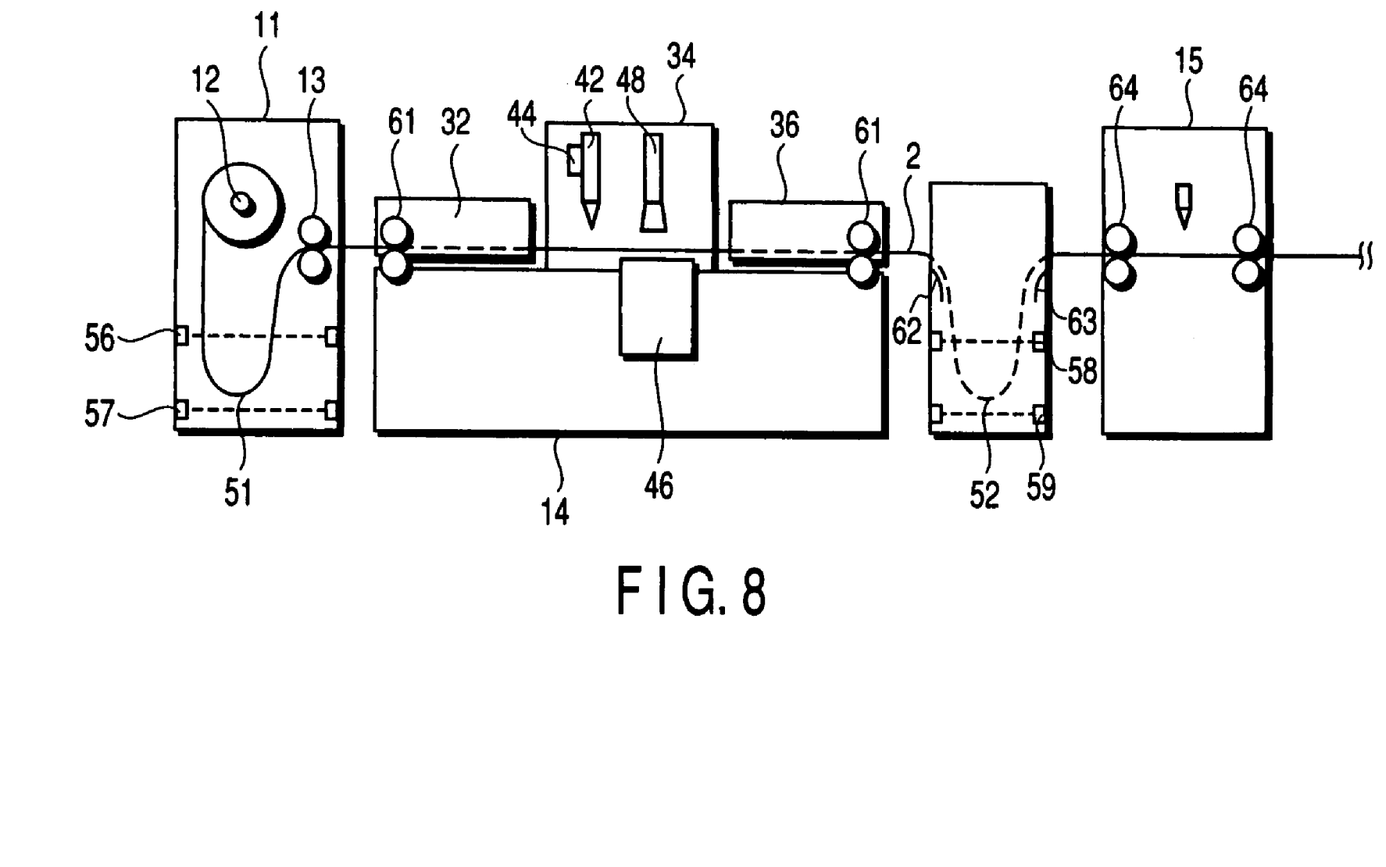
FIG. 8 is an enlarged schematic diagram showing a main part of the manufacturing line of FIG. 7.

As shown in FIG. 8, the storage device 51 of the feeder 11 stores the hoop substrate 2 between a feed shaft 12 and a conveyor roller 13 such that the hoop substrate 2 is sagged downwardly. The storage device 51 has two sensors 56 and 57 for detecting the hoop substrate 2 sagged due to storage. The sensors 56 and 57 are separated by a distance, and each sensor has an optical axis that is cut off by the hoop substrate 2.

For example, if the process speed of the chip mounting device 14 becomes faster than the feeding speed of the feed shaft 12 in a state where the lower end of the hoop substrate 2 is positioned between the upper sensor 56 and the lower sensor 57 as shown in FIG. 8, i.e., the sensor 56 dark and the sensor 57 bright, the lower end of the hoop substrate 2 rises and the sensor 56 becomes bright. In this case, on the basis of the sensor 56 bright as a trigger, the conveyor roller 13 and a conveyor mechanism 61 of the chip mounting device 14 are stopped. Then, on the basis of the sensor 56 dark as a trigger, the operations of the conveyor roller 13 and the conveyor mechanism 61 are resumed.

On the other hand, in a state of the sensor 56 dark and the sensor 57 bright as shown in FIG. 8, for example, if the chip mounting device 14 is stopped for some reason, the lower end of the stored hoop substrate 2 falls down and the sensor 57 turns dark. In this case, the feed shaft 12 is stopped on the basis of the sensor 57 dark as a trigger. Then, on the basis of the sensor 57 bright as a trigger, the feeding operation of the feed shaft 12 is resumed.

That is, the storage amount of the hoop substrate 2 in the storage device 51 is determined by the height position of the two sensors 56 and 57. The position of the upper sensor 56 determines the minimum storage amount, and the position of the lower sensor 57 determines the maximum storage amount. The storage device 55 of the winding device 18 also has two sensors 56 and 57, and functions like the storage device 51.

The storage device 52 provided between the chip mounting device 14 and the wire bonding device 15 has an inlet guide 62 for guiding the hoop substrate 2 entering from the chip mounting device 14 to be sagged downward, and an outlet guide 63 for guiding the hoop substrate 2 to be sent out to the wire bonding device 15. The storage device 52 also has upper and lower sensors 58 and 59, like the above-described storage device 51.

For example, if the storage amount of the hoop substrate 2 as shown in FIG. 8 is reduced and the sensor 58 turns bright, a conveyor mechanism 64 of the wire bonding device 15 at the downstream side is stopped. If the storage amount is increased and the sensor 59 turns dark, the conveyor mechanism 61 of the chip mounting device 14 at the upstream side is stopped. That is, the storage amount is adjusted so that the sagged lower end of the stored hoop substrate 2 may be consistently positioned between the sensor 58 and the sensor 59.

The other two storage devices 53 and 54 have structures and functions similar to the storage device 52. By stopping, if necessary, the devices at upstream and downstream sides, the storage devices 53 and 54 store the hoop substrate 2 with a storage amount within a predetermined range.

Figure 9:
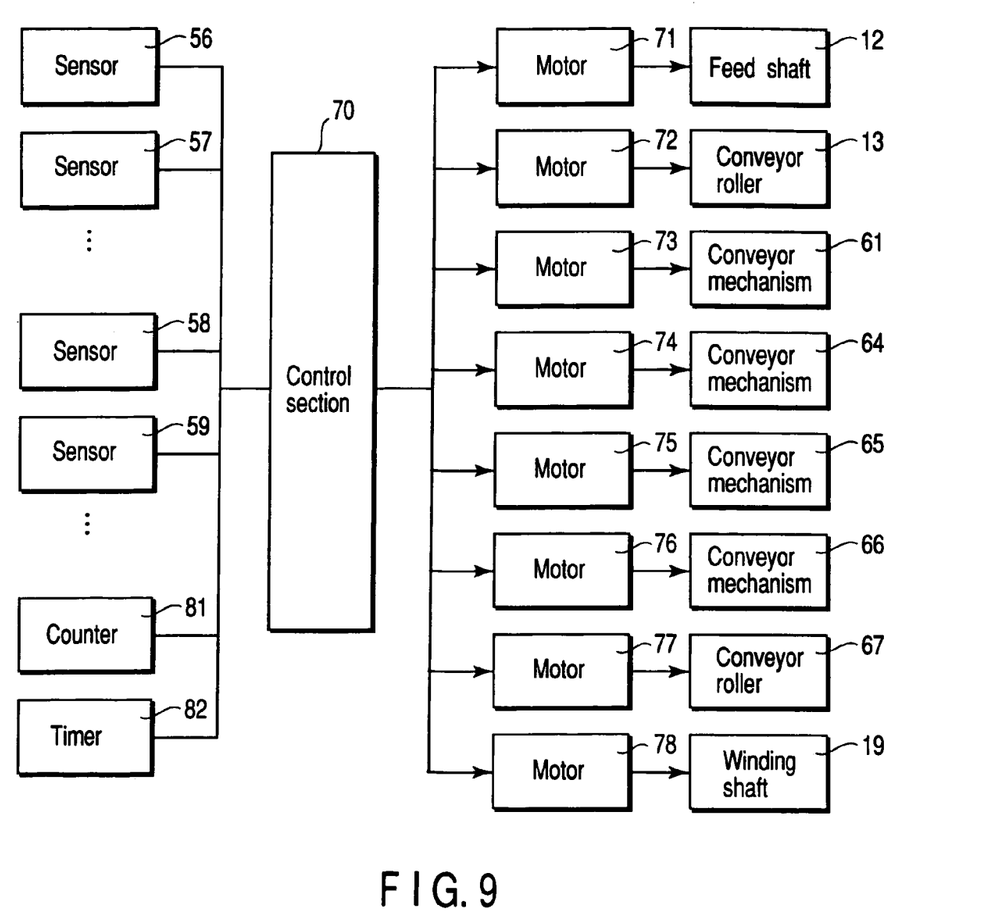
FIG. 9 is a block diagram showing a control system for controlling an operation of the manufacturing line of FIG. 7.

FIG. 9 is a block diagram showing a control system for the manufacturing line 50 having the storage devices 51 to 55 as described above.

A control section 70 for the manufacturing line 50 is connected to a motor 71 for rotating the feed shaft 12 in both normal and reverse directions, a motor 72 for rotating the conveyor roller 13 in both normal and reverse directions, a motor 73 for driving the conveyor mechanism 61 of the chip mounting device 14 in both normal and reverse directions, a motor 74 for driving the conveyor mechanism 64 of the wire bonding device 15, a motor 75 for driving the conveyor mechanism 65 of the mold device 16, a motor 76 for driving the conveyor mechanism 66 of the inspection device 17, a motor 77 for rotating the conveyor roller 67, and a motor 78 for rotating the winding shaft 19.

The control section 70 is also connected to the sensors 56, 57, 58 and 59 of each of the storage devices 51 to 55, a counter 81 for counting the sprocket holes 2b of the hoop substrate 2 passing through the chip mounting device 14, and a timer 81.

Incidentally, if the manufacturing line 50 stops for some reason for a relatively long time, the hoop substrate 2 that has passed through the bake oven 32 of the chip mounting device 14 cools down and absorbs moisture again. Thus, in this embodiment, if the manufacturing line 50 is inactive longer than the period up to the point the hoop substrate 2 starts absorbing moisture, the hoop substrate 2 is reversed to be re-dried.

Specifically, if the chip mounting device 14 stops for some reason, the timer 82 is set and counting of the down time is started. If the conveyor mechanism 61 of the chip mounting device 14 stops for a predetermined period of time (10 minutes in this embodiment), the hoop substrate 2 is reversed by a predetermined distance by the conveyor mechanism 61. The distance by which the hoop substrate 2 is reversed, i.e., the operation time of the conveyor mechanism 61, is controlled by counting the sprocket holes 2b in the hoop substrate 2 using the counter 81. It is set that the portion of the hoop substrate 2 that has passed through the die bonding device 34 is reversed at least to the entrance of the bake oven 32. The reversed hoop substrate 2 is stored in the storage device 51 of the feeder 11, or wound by rotating the feed shaft 12 backward.

The causes for the chip mounting device 14 stopping for 10 minutes includes problems in the other devices 11, 15, 16, 17 and 18 and the sensor 59 of the storage device 52 provided downstream the cure oven 36 being dark for ten minutes, or the chip mounting device 14 itself stopping for ten minutes due to some problem. In the latter case, the storage device 52 is stopped on the basis of the sensor 58 bright as a trigger, and the storage amount of the hoop substrate 2 is at the minimum.

Thus, in order to prevent the conveyor mechanism of the other devices 15 to 18 from operating when the hoop substrate 2 is reversed, it is necessary to set the height position of the upper sensor 58 of the storage device 52 provided downstream of the chip mounting device 14 as follows. That is, if the hoop substrate 2 is reversed through the chip mounting device 14, it is necessary to dispose the sensor 58 at the height position that can store the minimum amount of the hoop substrate 2 corresponding to the distance to be returned, in order to reverse only part of the hoop substrate 2 being stored in the storage device 52.

With respect to the other storage devices 51, 53, 54 and 55, there is no special constraint concerning the above-described sensor position. It is chosen, if necessary, according to the operation conditions such as the process speed of each device, conveyor method, etc.

As described above, according to the embodiment of the present invention, by providing a plurality of storage devices 51 to 55 in the manufacturing line 50, the processing can continue without stopping the manufacturing line 50, if each of the devices 11, 14, 15, 16, 17 and 18 stops for a short period of time. The process efficiency can thus be improved.

According to the embodiment of the present invention, if the manufacturing line 50 stops for a relatively long time, the hoop substrate 2 can be fed backwards to be dried, bubbles can be prevented from forming when the adhesive is heat-cured, and the IC chip 4 can be prevented from being bonded out of place. Thus, the yield can be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

For example, in the first and second embodiments described above, the manufacturing line 1 comprising the bake oven 32 as a pretreatment section is described. However, the present invention is not limited to the above, and a dry air chamber (drying section) 32 may be provided. In this case, if the hoop substrate 2 is passed through the dry air chamber 32, dry air or warm air is blown over the surface of the hoop substrate 2, thereby drying the hoop substrate 2.

Figure 10:
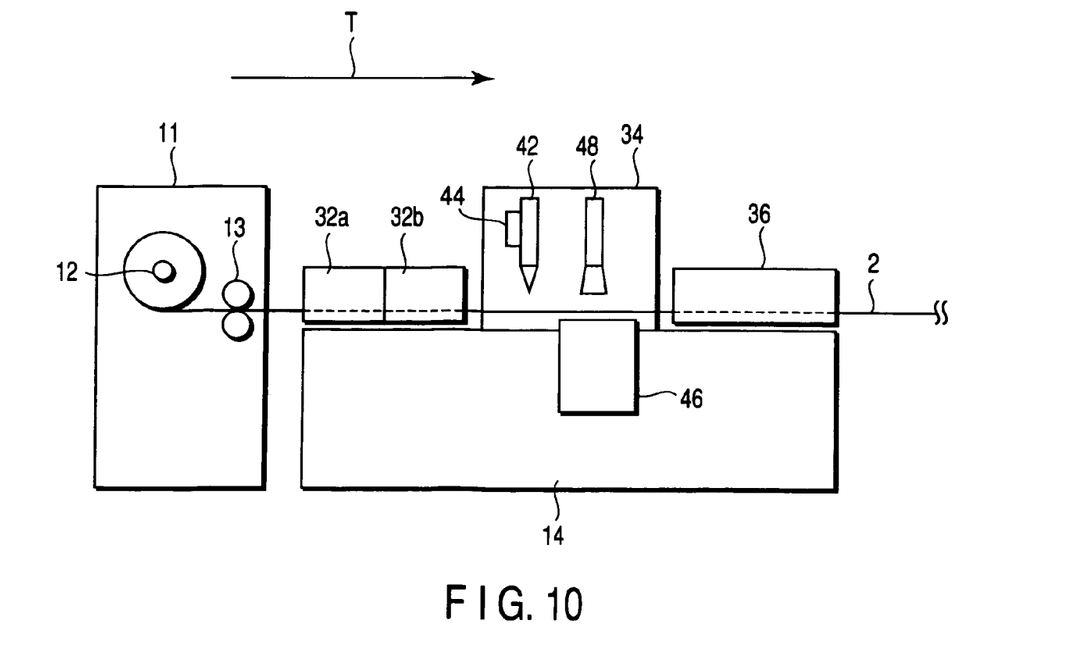
FIG. 10 is a schematic diagram showing a main part of a modification of the manufacturing line.

As shown in FIG. 10, as a pretreatment section, a bake oven 32a and a dry air chamber 32b, for example, may be provided adjacent to each other. In this case, the hoop substrate 2 is passed through the bake oven 32a to be heated, and then passed through the dry air chamber 32b to be dried. Alternatively, the bake oven 32a may be provided behind the dry air chamber 32b. By providing the bake oven 32a and the air dry chamber 32b in a line, as described above, the hoop substrate 2 can be dried with more reliability, thus the processing time required for drying can be reduced, and the length of the pretreatment section can be shortened.

In the second embodiment described above, the sensor signal from each of the storage devices 51 to 55 is used as a trigger, and the device on the downstream or upstream side is stopped. However, the present invention is not limited to the above. The control section 70 may monitor the storage amount of the hoop substrate 2 in all the storage devices 51 to 55, and control the stopping of each of the devices 11, 14, 15, 16, 17 and 18 as a manufacturing line on the whole.

Further, in the second embodiment as described above, the sensor signal from each of the storage devices 51 to 55 is used as a trigger, and the device on the downstream or upstream side is stopped. However, the corresponding device may not be completely stopped, but the conveying speed of the hoop substrate 2 by the conveyor mechanism may be decelerated.

What is claimed is:

1. An apparatus for manufacturing a semiconductor apparatus comprising:
- a feed mechanism which feeds a long tape-like substrate in a longitudinal direction thereof;
- a mounting section which mounts a semiconductor device by applying a heat-curable adhesive to a predetermined position on the substrate fed by the feed mechanism;
- a pretreatment section, provided immediately upstream of the mounting section, which heats and dries the substrate;
- a heating and curing section which heats and cures the adhesive applied in the mounting section; and
- wherein said feed mechanism returns the substrate in a reverse direction by a predetermined distance such that the substrate in the mounting section is moved to the entrance of the pretreatment section, if the substrate is stopped for a predetermined period of time.

2. An apparatus according to claim 1, further comprising:
- a bonding section which electrically connects the semiconductor device bonded in the heating and curing section to the substrate;
- a molding section which molds the semiconductor device connected by bonding to the substrate in the bonding section; and
- a winding mechanism which winds the substrate which has passed through the molding section.

3. An apparatus according to claim 2, further comprising an inspection section, provided upstream of the winding mechanism, which inspects the semiconductor device and the substrate which have passed through the molding section.

4. An apparatus according to claim 1, wherein said pretreatment section includes a heating section which heats the substrate and a drying section which dries the substrate.

5. An apparatus according to claim 1, wherein said mounting section has a heater which preheats the adhesive.

6. An apparatus for manufacturing a semiconductor apparatus comprising:
- a feed mechanism which feeds a long tape-like substrate in a longitudinal direction thereof;
- a mounting section which mounts a semiconductor device by applying a heat-curable adhesive to a predetermined position on the substrate fed by the feed mechanism;
- a pretreatment section, provided immediately upstream of the mounting section, which heats and dries the substrate;
- a heating and curing section which heats and cures the adhesive applied in the mounting section;
- a storage section which stores the substrate fed by the feed mechanism and stores the substrate which has passed through the heating and curing section;
- wherein the feed mechanism returns the substrate stored in the storage section in a reverse direction by a predetermined distance such that the substrate in the mounting section is moved to the entrance of the pretreatment section, if the substrate is stopped for a predetermined period of time.

7. An apparatus according to claim 6, wherein said storage section stores a length of the substrate at least equal to the amount to be returned by a predetermined distance.

* * * * *